(12) United States Patent
Shimizu

(10) Patent No.: US 10,412,350 B2
(45) Date of Patent: Sep. 10, 2019

(54) HEAT TRANSPORT DEVICE AND PROJECTOR

(71) Applicant: SEIKO EPSON CORPORATION, Tokyo (JP)

(72) Inventor: Katsuya Shimizu, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/854,482

(22) Filed: Dec. 26, 2017

(65) Prior Publication Data

US 2018/0199016 A1   Jul. 12, 2018

(30) Foreign Application Priority Data

Jan. 6, 2017 (JP) .................. 2017-000921

(51) Int. Cl.
| | | |
|---|---|---|
| F28D 15/04 | (2006.01) | |
| F28D 15/06 | (2006.01) | |
| F28D 15/02 | (2006.01) | |
| H04N 9/31 | (2006.01) | |
| G03B 21/16 | (2006.01) | |
| H01L 23/427 | (2006.01) | |
| G02F 1/1333 | (2006.01) | |

(52) U.S. Cl.
CPC ....... *H04N 9/3144* (2013.01); *F28D 15/0266* (2013.01); *F28D 15/043* (2013.01); *F28D 15/06* (2013.01); *G03B 21/16* (2013.01); *H01L 23/427* (2013.01); *H04N 9/3155* (2013.01); *H04N 9/3194* (2013.01); *G02F 1/133385* (2013.01)

(58) Field of Classification Search
CPC .................. F28D 15/0275; F28D 15/0266
See application file for complete search history.

(56) References Cited

U.S. PATENT DOCUMENTS

| | | | | |
|---|---|---|---|---|
| 6,481,850 B1 * | 11/2002 | Takezawa | ......... | G02F 1/133528 348/E9.027 |
| 9,455,212 B2 | 9/2016 | Uchida et al. | | |
| 2005/0007556 A1 * | 1/2005 | Yanagisawa | ......... | H04N 9/3141 353/31 |
| 2005/0213228 A1 * | 9/2005 | Fujimori | ................ | G03B 21/16 359/820 |
| 2009/0086169 A1 * | 4/2009 | Nakamura | ........... | G03B 21/006 353/31 |
| 2010/0176310 A1 * | 7/2010 | Moriya | ............... | G03F 7/70033 250/493.1 |

(Continued)

FOREIGN PATENT DOCUMENTS

| | | |
|---|---|---|
| JP | 2012-255577 A | 12/2012 |
| WO | 2011/061952 A1 | 5/2011 |

*Primary Examiner* — Paulos M Natnael
(74) *Attorney, Agent, or Firm* — Oliff PLC

(57) ABSTRACT

A heat transport device includes a loop heat pipe configured in the form of a loop, and a control unit configured to control an amount of heat generated by a heat generating part when the loop heat pipe starts up. The loop heat pipe includes an evaporating unit configured to receive heat of a heat generating part as a cooling target and evaporate a hydraulic fluid, a condensing unit configured to radiate heat and condense vapor obtained by evaporation of the hydraulic fluid, a vapor pipe which connects the evaporating unit and the condensing unit to each other, and a liquid pipe which connects the condensing unit and the evaporating unit to each other.

12 Claims, 7 Drawing Sheets

(56) References Cited

U.S. PATENT DOCUMENTS

| | | | |
|---|---|---|---|
| 2012/0075864 A1* | 3/2012 | Nishi | G03B 21/16 |
| | | | 362/294 |
| 2012/0227954 A1 | 9/2012 | Uchida et al. | |
| 2013/0044432 A1* | 2/2013 | Ogata | H05K 7/20336 |
| | | | 361/700 |
| 2016/0301902 A1* | 10/2016 | Nakamura | H04N 9/3144 |
| 2018/0031956 A1* | 2/2018 | Nemura | G03B 21/142 |
| 2018/0152679 A1* | 5/2018 | Matsumoto | G02F 1/13 |
| 2018/0199016 A1* | 7/2018 | Shimizu | H04N 9/3144 |

* cited by examiner

HEAT TRANSPORT DEVICE AND PROJECTOR

BACKGROUND

1. Technical Field

The present invention relates to a heat transport device and a projector having a heat transport device.

2. Related Art

According to the related art, a loop heat pipe is known as a cooling device used for various electronic devices. The loop heat pipe is configured of an evaporating unit which evaporates a hydraulic fluid with the heat from a heat generating body, a condensing unit which radiates the heat of the evaporated hydraulic fluid and thus condenses the vapor, and a vapor pipe and a liquid pipe which connect the evaporating unit and the condensing unit in the shape of a loop. The loop heat pipe like this takes time to start up because a cooling cycle is not established until the hydraulic fluid present in the vapor flow path within the evaporating unit is completely evaporated.

JP-A-2012-255577 discloses a technique in which a temperature difference is provided between the vapor pipe and the liquid pipe, thus reducing the startup time of the loop heat pipe. WO2011/061952 discloses a technique in which the vapor pipe is heated to eliminate the liquid in the vapor pipe, thus reducing the startup time of the loop heat pipe.

However, the technique of JP-A-2012-255577 has some problems such as the need for a heat storage material other than the loop heat pipe and the difficulty in coping with the case where the amount of heat generated is variable. Meanwhile, the technique of WO2011/061952 prevents condensation within the vapor pipe by heating the vapor pipe with a heating device. However, this technique is not very promising in terms of reduction in startup time, though the technique contributes to stable operation of the loop heat pipe.

If the loop heat pipe takes time to start up, there is a problem that the heating temperature of an electronic component as a cooling target may overshoot. Also, if the amount of heat generated by the electronic component is small or if there is a large influence of heat leak or the like, there is a problem that the loop heat pipe does not start up.

Thus, a heat transport device which reduces the startup time of the loop heat pipe, and a projector having a heat transport device are demanded.

SUMMARY

An advantage of some aspects of the invention is to solve at least a part of the problems described above, and the invention can be implemented as the following configurations or application examples.

A heat transport device according to this application example includes: a loop heat pipe configured in the form of a loop, the loop heat pipe including an evaporating unit configured to receive heat of a heat generating part as a cooling target and evaporate a hydraulic fluid, a condensing unit configured to radiate heat and condense vapor obtained by evaporation of the hydraulic fluid, a vapor pipe which connects the evaporating unit and the condensing unit to each other, and a liquid pipe which connects the condensing unit and the evaporating unit to each other; and a control unit configured to control an amount of heat generated by the heat generating part when the loop heat pipe starts up.

In the heat transport device according to this application example, the control unit controls the amount of heat generated by the heat generating part when the loop heat pipe starts up. Thus, the evaporation of the hydraulic fluid in the evaporating unit can be controlled (for example, facilitated). Therefore, the startup time of the loop heat pipe can be controlled as well (for example, reduced). Also, the overshoot of the heating temperature of the cooling target can be controlled (for example, restrained).

It is preferable that the heat transport device according to the application example includes a temperature detection unit configured to detect a temperature of at least one of the evaporating unit and the heat generating part, and that the control unit is configured to temporarily set the amount of heat generated by the heat generating part to a rated amount of heat generated or larger when the detected temperature is lower than a predetermined temperature.

In the heat transport device according to this application example, with a simple configuration having the temperature detection unit for detecting the temperature of at least one of the evaporating unit and the heat generating part, the control unit compares the detected temperature detected by the temperature detection unit with a predetermined temperature, and controls the amount of heat generated by the heat generating part to be temporarily a rated amount of heat generated or larger when the detected temperature is lower than the predetermined temperature. Thus, the evaporation of the hydraulic fluid in the evaporating unit can be facilitated and the startup time of the loop heat pipe can be reduced. Also, the overshoot of the heating temperature of the cooling target can be restrained.

It is preferable that the heat transport device according to the application example includes an elapsed time measuring unit configured to measure an elapsed time from startup of the cooling target, and that the control unit is configured to temporarily set the amount of heat generated by the heat generating part to a rated amount of heat generated or larger when the measured elapsed time is shorter than a predetermined time.

In the heat transport device according to this application example, with a simple configuration having the elapsed time measuring unit for measuring an elapsed time from the startup of the cooling target, the control unit compares the elapsed time measured by the elapsed time measuring unit with a predetermined time, and controls the amount of heat generated by the heat generating part to be temporarily a rated amount of heat generated or larger when the elapsed time is shorter than the predetermined time. Thus, the evaporation of the hydraulic fluid in the evaporating unit can be facilitated and the startup time of the loop heat pipe can be reduced. Also, the overshoot of the heating temperature of the cooling target can be restrained.

It is preferable that the heat transport device according to the application example includes a cooling fan configured to cool the condensing unit, and that the cooling fan is stopped or has its number of rotations restrained until the loop heat pipe is started up.

In the heat transport device according to this application example, until the loop heat pipe starts up, the cooling of the condensing part with the cooling fan is not particularly necessary and therefore the cooling fan may be stopped. Alternatively, the cooling fan may be made to operate with the number of rotations restrained. Thus, energy saving and noise reduction can be achieved.

A projector according to this application example includes: the heat transport device according to one of the foregoing application examples; a light source device configured to emit light; a light modulation device configured to modulate the light emitted from the light source device, according to image information; and a projection device configured to project the light modulated by the light modulation device.

The projector according to this application example has the heat transport device in which the startup time of the loop heat pipe is reduced. Therefore, when the projector is driven, the cooling target that generates heat can be cooled properly. Also, the overshoot of the heating temperature of the cooling target can be restrained.

In the projector according to the application example, it is preferable that the cooling target is the light source device.

It is also preferable that the projector according to the above application example includes a light source device drive unit configured to supply drive power to the light source device and drive the light source device, and that the control unit is configured to adjust the drive power supplied to the light source device and thus control the amount of heat generated by the light source device as the heat generating part, when the loop heat pipe starts up.

In the projector according to the application example, it is also preferable that the control unit is configured to supply the light source device with a drive power higher than a drive power supplied when the light source device operates normally and then set the amount of heat generated by the light source device to a rated amount of heat generated or larger.

In the projector according to this application example, with respect to the light source device generating a large amount of heat, particularly the light source device having a laser light source, the overshoot of the heating temperature can be restrained and proper cooling can be carried out.

It is preferable that the projector according to the application example includes a light adjusting device configured to adjust a quantity of the light emitted from the light source device, and that the light adjusting device restrains the quantity of light until the loop heat pipe is started up.

As the amount of heat generated by the light source device is controlled to be temporarily a rated amount of heat generated or larger in order to reduce the startup time of the loop heat pipe, the quantity of light becomes a rated quantity of light or larger and the luminance of an image projected on a screen or the like becomes larger than a rated value. Thus, in the projector according to this application example, the light adjusting device is provided and therefore the quantity of light is restrained and adjusted to a rated quantity of light until the loop heat pipe starts up. Thus, the luminance until the loop heat pipe starts up can be made equivalent to the luminance at the time of normal operation after the startup. Therefore, the user can be restrained from feeling a sense of incongruity due to the difference in the luminance of the projected image.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
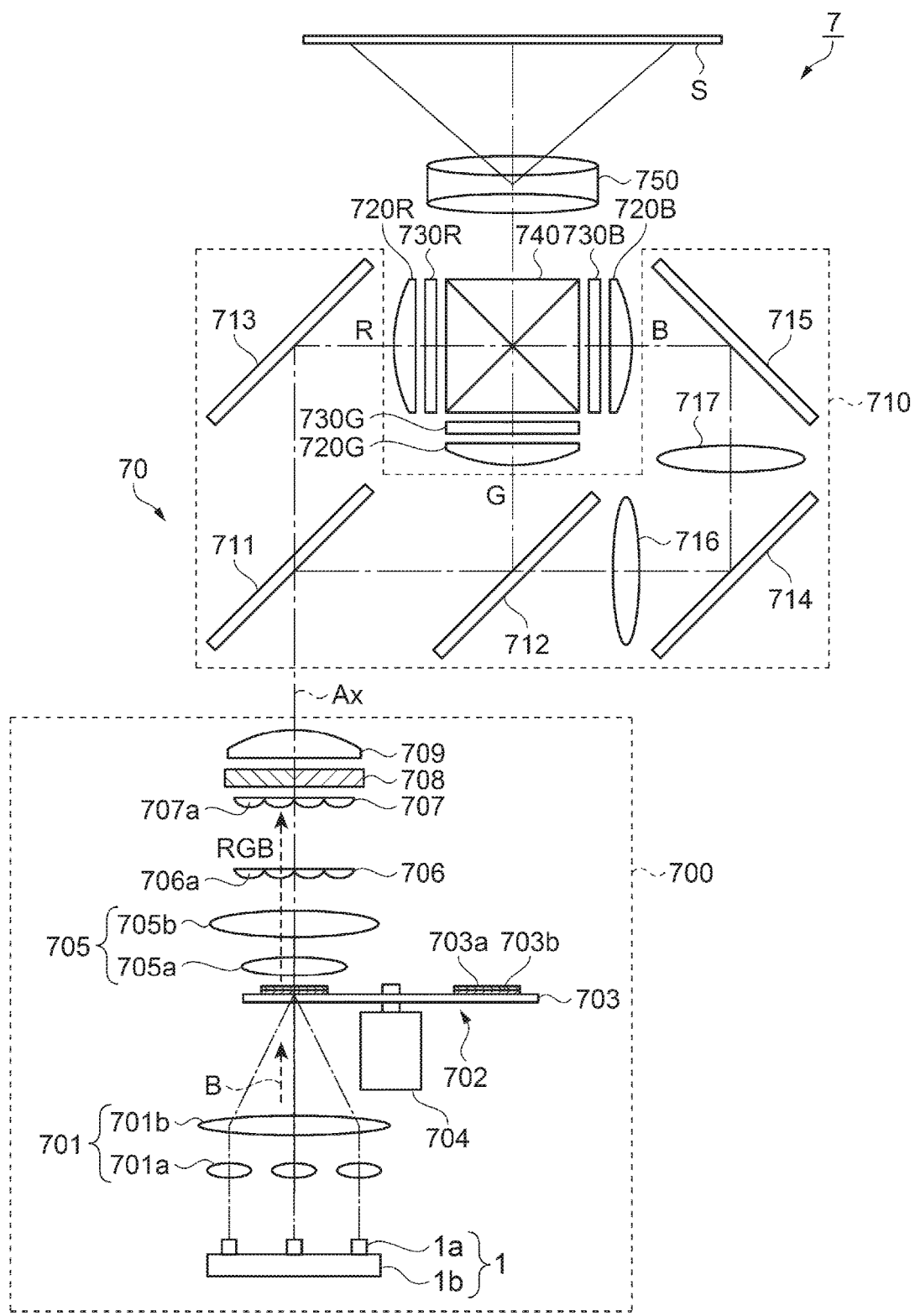
FIG. 1 shows a schematic configuration of an optical system of a projector according to a first embodiment.

Hereinafter, embodiments of the invention will be described with reference to the drawings.
First Embodiment FIG. 1 shows the configuration of an optical system 70 of a projector 7 according to a first embodiment. The optical system 70 of the projector 7 in this embodiment is configured using a light source device 1 made up of a laser light source 1a, and a light modulation device made up of a transmission-type liquid crystal panel. The configuration of the optical system 70 of the projector 7 will be described with reference to FIG. 1. Also, a heat transport device 100 according to an embodiment of the invention is configured as a device which cools the light source device 1 as a cooling target. The heat transport device 100 will be described later.

As shown in FIG. 1, the projector 7 has an illumination device 700, a color separation system 710, three liquid crystal panels 730R, 730G, 730B as light modulation devices, a color combining device 740, and a projection system 750.

The projector 7 operates roughly as follows. The light emitted from the illumination device 700 is separated into a plurality of color lights by the color separation system 710. The plurality of color lights separated by the color separation system 710 becomes incident on and modulated by the corresponding liquid crystal panels 730R, 730G, 730B. The plurality of color lights modulated by the liquid crystal panels 730R, 730G, 730B becomes incident on and combined by the color combining device 740. The light combined by the color combining device 740 is projected in an enlarged manner on a screen S or the like by the projection system 750. Thus, a full-color projected image is displayed.

Each component of the projector 7 will be briefly described below.

The illumination device 700 includes the light source device 1 made up of the laser light source 1a, a condensing optical system 701, a light emitting element 702, a collimating system 705, lens arrays 706, 707, a polarization conversion element 708, and a superimposing lens 709, arranged in this order.

The light source device 1 emits a blue laser beam as excitation light to excite a fluorescent substance provided in the light emitting element 702, described later. While a plurality of (in FIG. 1, three) laser light sources 1a is provided in this example, a configuration having only one laser light source 1a may be employed.

The condensing optical system 701 has a plurality of first lenses 701a that are convex lenses, and a second lens 701b that is a convex lens on which the light transmitted through each lens of the plurality of first lenses 701a equally becomes incident. The condensing optical system 701 is arranged on the optical axis of the laser beam emitted from the light source device 1 and condenses the excitation light emitted from the plurality of laser light sources 1a.

The light emitting element 702 is a so-called transmission-type rotary fluorescent plate. At a part of a disk 703 that can be rotated by a motor 704, a single fluorescent layer 703a is continuously formed along the circumferential direction of the disk 703. The area where the fluorescent layer 703a is formed includes an area where blue light becomes incident. The light emitting element 702 is configured to emit red light and green light toward the side opposite to the side where blue light becomes incident. The light emitting element 702 rotates at such a rotational speed that the condensation spot of blue light moves on the fluorescent layer 703a at a predetermined speed.

The disk 703 is made of a material that transmits blue light. As the material of the disk 703, for example, quartz glass, crystal, sapphire, optical glass, transparent resin or the like can be used.

The blue light from the light source device 1 is configured to become incident on the light emitting element 702 from the side of the disk 703. The fluorescent layer 703a is formed on the disk 703 via a dichroic filter 703b which transmits blue light and reflects red light and green light. The dichroic filter 703b is formed of, for example, a dielectric multilayer film. Therefore, the fluorescent layer 703a is efficiently excited by blue light with a predetermined wavelength, converts a part of the blue light emitted from the light source device 1 into yellow light (fluorescence) containing red light and green light, emits this yellow light, and transmits the rest of the blue light without conversion.

The collimating system 705 has a first lens 705a which restrains the light from the light emitting element 702 from spreading, and a second lens 705b which substantially parallelizes the light from the first lens 705a. The collimating system 705 as a whole has the function of substantially parallelizing the light from the light emitting element 702. The first lens 705a and the second lens 705b are configured of convex lenses.

The first lens array 706 has a plurality of first small lenses 706a for splitting the light from the collimating system 705 into a plurality of partial luminous fluxes. The first lens array 706 is configured in such a way that the plurality of first small lenses 706a is arranged in the form of a matrix having a plurality of rows and a plurality of columns within a plane orthogonal to an illumination optical axis Ax.

The second lens array 707 has a plurality of second small lenses 707a corresponding to the plurality of first small lenses 706a of the first lens array 706. The second lens array 707, with the superimposing lens 709, has the function of forming an image of each first small lens 706a of the first lens array 706 near an image forming area of the liquid crystal panels 730R, 730G, 730B. The second lens array 707 is configured in such a way that the plurality of second small lenses 707a is arranged in the form of a matrix having a plurality of rows and a plurality columns within a plane orthogonal to the illumination optical axis Ax.

Also, a light adjusting device 80 (FIG. 3) which adjust the quantity of light of the light emitted from the first lens array 706 (the quantity of light of the light emitted from the light source device 1) is provided between the first lens array 706 and the second lens array 707. The light adjusting device 80 will be described later.

The polarization conversion element 708 is a polarization conversion element which turns the directions of polarization of the respective partial luminous fluxes split by the first lens array 706 into the same direction and thus emits these partial luminous fluxes as linearly polarized light of substantially one kind.

The superimposing lens 709 is an optical element for condensing the respective partial luminous fluxes from the polarization conversion element 708 and superimposing the condensed partial luminous fluxes near the image forming area of the liquid crystal panels 730R, 730G, 730B. The first lens array 706, the second lens array 707, and the superimposing lens 709 form an optical integration system which makes even the in-plane light intensity distribution of the light from the light emitting element 702.

The color separation system 710 has dichroic mirrors 711, 712, reflection mirrors 713, 714, 715, and relay lenses 716, 717. The color separation system 710 has the function of separating the light from the illumination device 700 into red light, green light, and blue light, and guiding the red light, the green light, and the blue light to the liquid crystal panels 730R, 730G, 730B, respectively, as illumination targets. Condensing lenses 720R, 720G, 720B are arranged between the color separation system 710 and the liquid crystal panels 730R, 730G, 730B.

Each of the dichroic mirrors 711, 712 is a mirror having, on a substrate, a wavelength-selective transmission film which reflects a light of a predetermined wavelength range and transmits light of the other wavelength ranges. The dichroic mirror 711 is a dichroic mirror which transmits the red light component and reflects the green light component and the blue light component. The dichroic mirror 712 is a dichroic mirror which reflects the green light component and transmits the blue light component. The reflection mirror 713 is a reflection mirror which reflects the red light component. The reflection mirrors 714, 715 are reflection mirrors which reflect the blue light component.

The red light component transmitted through the dichroic mirror 711 is reflected by the reflection mirror 713, is transmitted through the condensing lens 720R, and becomes incident on an image forming area of the liquid crystal panel 730R for red light. The green light reflected by the dichroic mirror 711 is further reflected by the dichroic mirror 712, is transmitted through the condensing lens 720G, and becomes incident on an image forming area of the liquid crystal panel 730G for green light. The blue light transmitted through the dichroic mirror 712 travels via the relay lens 716, the light incident-side reflection mirror 714, the relay lens 717, the light exiting-side reflection mirror 715, and the condensing lens 720B, and becomes incident on an image forming area of the liquid crystal panel 730B for blue light. The relay lenses 716, 717 and the reflection mirrors 714, 715 have the function of guiding the blue light component transmitted through the dichroic mirror 712, to the liquid crystal panel 730B.

These relay lenses 716, 717 are provided in the optical path of the blue light in order to prevent a reduction in the utilization efficiency of light due to diffusion of light or the like, because the optical path of the blue light is that the length of the optical path of the blue light is longer than the lengths of the optical paths of the other color lights. In the projector 7 in this embodiment, such a configuration is employed since the length of the optical path of the blue light is longer. However, it is also possible to employ a configuration in which the length of the optical path of the red light is made longer and in which the relay lenses 716, 717 and the reflection mirrors 714, 715 are used in the optical path of the red light.

The liquid crystal panels 730R, 730G, 730B are configured to modulate the incident color light according to image information so as to form a color image light. The liquid crystal panels 730R, 730G, 730B are illumination targets to be illuminated by the illumination device 700. Although not illustrated, light incident-side polarizers are arranged between the respective condensing lenses 720R, 720G, 720B and the respective liquid crystal panels 730R, 730G, 730B, and light exiting-side polarizers are arranged between the respective liquid crystal panels 730R, 730G, 730B and the color combining device 740. The light modulation of each incident color light is carried out by the light incident-side polarizers, the liquid crystal panels 730R, 730G, 730B, and the light exiting-side polarizers.

Each of the liquid crystal panels 730R, 730G, 730B is a transmission-type panel formed of a pair of transparent glass substrates with liquid crystal as an electro-optical material sealed airtightly between the glass substrates. Each of the liquid crystal panels 730R, 730G, 730B uses, for example, a polysilicon TFT as a switching element and modulates the direction of polarization of the one kind of linearly polarized light emitted from the light incident-side polarizer, according to the image signal supplied thereto.

The color combining device 740 is an optical element which combines the optical images modulated for each color light emitted from the light exiting-side polarizers and thus forms a color image light. The color combining device 740 is substantially square as viewed in a plan view, having four right-angled prisms joined together. Dielectric multilayer films are formed on substantially X-shaped interfaces where the right-angled prisms are joined together. The dielectric multilayer film formed on one of the substantially X-shaped interfaces reflects the red light. The dielectric multilayer film formed on the other interface reflects the blue light. By these dielectric multilayer films, the red light and the blue light are bent into the same direction as the traveling direction of the green light. Thus, the three color lights are combined together.

The color image light emitted from the color combining device 740 is projected in an enlarged manner by the projection system 750 and forms a color image on the screen S.

Figure 2:
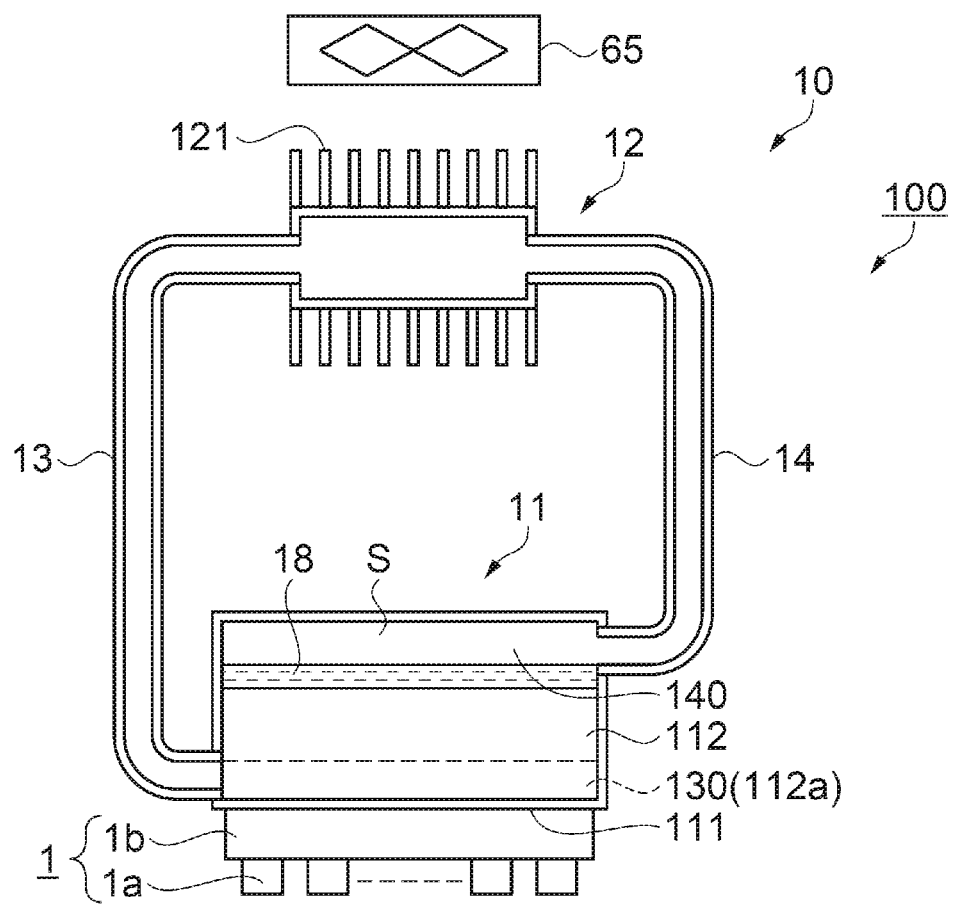
FIG. 2 shows a schematic configuration of a heat transport device.

FIG. 2 schematically shows a schematic configuration of a loop heat pipe 10. Referring to FIG. 2, the configuration of the loop heat pipe 10 of the projector 7 will be described. The loop heat pipe 10 in this embodiment is configured as a device which cools the heat generated by the light source device 1. In FIG. 2, the excitation light emitted from the light source device 1 is set to be downward in the illustration.

As shown in FIG. 2, the heat transport device 100 has the so-called loop heat pipe 10. The loop heat pipe 10 is configured in a loop made up of an evaporating unit 11, a condensing unit 12, a vapor pipe 13, and a liquid pipe 14, and has a hydraulic fluid 18 sealed inside.

The evaporating unit 11 has a heat receiving unit 111 and a porous body 112. The evaporating unit 11 is configured in the shape of a rectangular box corresponding to the shape of a base part 1b which is rectangular as viewed in a plan view and which supports and fixes a circuit board (not illustrated) for driving the laser light source 1a of the light source device 1 and a fixing part (not illustrated). The heat receiving unit 111 is formed in a rectangular shape corresponding to the shape of the base part 1b, is connected to the base part 1b via thermally conductive grease (not illustrated) or the like, and receives heat from the base part 1b. The heat receiving unit 111 is formed of a material with high thermal conductivity such as copper.

The heat receiving unit 111 is hollow. In this hollow, the flat plate-like porous body 112 is accommodated in such a way as to separate a vapor flow path 130 as a flow path communicating with the vapor pipe 13, described later, and a hydraulic fluid flow path 140 as a flow path communicating with the liquid pipe 14, described later.

The vapor pipe 13 is connected to the vapor flow path 130 of the evaporating unit 11, connects the evaporating unit 11 and the condensing unit 12 to each other, and guides the vapor generated in the evaporating unit 11 to the condensing unit 12.

The condensing unit 12 has a heat sink 121. The condensing unit 12 causes the heat sink 121 to radiate heat, thus condenses the vapor, and generates the hydraulic fluid 18. A cooling fan 65, described later, is installed near the condensing unit 12. The heat radiation from the heat sink 121 is facilitated by the driving of the cooling fan 65.

The liquid pipe 14 is connected to the hydraulic fluid flow path 140 of the evaporating unit 11, connects the evaporating unit 11 and the condensing unit 12 to each other, and guides the hydraulic fluid 18 generated in the condensing unit 12 to the evaporating unit 11. The vapor pipe 13, the liquid pipe 14, and the condensing unit 12 are formed of metal pipes, for example, of copper or the like.

As the hydraulic fluid 18 sealed in the loop heat pipe 10, water, a fluorine-based solution such as Fluorinert, and alcohols such as ethanol can be used. In this embodiment, water is used as the hydraulic fluid 18.

One outer surface of the porous body 112 accommodated inside (in the hollow of) of the evaporating unit 11 is in contact with the inner wall of the evaporating unit 11 that faces this surface. Also, on the one outer surface of the porous body 112, a plurality of grooves 112a extending from the side of the liquid pipe 14 to the communicating side of the vapor pipe 13 is formed, for example, as in the form of slits. The plurality of grooves 112a forms the vapor flow path 130. The vapor flow path 130 (grooves 112a) communicates with the vapor pipe 13. The vapor flow path 130 may also be formed as slit-like grooves on the inner surface of the heat receiving unit 111 that is in contact with the one outer surface of the porous body 112, other than being configured as the grooves 112a on the outer surface of the porous body 112.

A space S is formed between the other outer surface of the porous body 112 and the inner wall of the evaporating unit 11 that faces this surface. The space S communicates with the liquid pipe 14. The space S functions as the hydraulic fluid flow path 140 and also functions as a reservoir part which temporarily stores the hydraulic fluid 18 guided through the liquid pipe 14.

The startup of the loop heat pipe 10 in this embodiment will be described. In the description below, it is assumed that the hydraulic fluid 18 is properly stored in the hydraulic fluid flow path 140 so that the pores (not illustrated) in the entire porous body 112 are filled with the hydraulic fluid 18.

As the evaporating unit 11 (heat receiving unit 111) receives heat from the base part 1b of the light source device 1, the one outer surface side of the porous body 112 is heated via the heat receiving unit 111. Since the one outer surface side of the porous body 112 is heated, vapor is generated on the one outer surface side and the generated vapor is gathered in the vapor flow path 130.

At this point, if the entirety of the porous body 112 is moisturized, the hydraulic fluid 18 is held within the pores of the porous body 112 by surface tension. Therefore, the generated vapor cannot pass through the porous body 112. Thus, as the pressure on the side of the vapor flow path 130 rises, the vapor pushes the hydraulic fluid 18 in the vapor pipe 13, the condensing unit 12, and the liquid pipe 14 toward the reservoir part (hydraulic fluid flow path 140). Subsequently, the hydraulic fluid 18 is supplied to the hydraulic fluid flow path 140, a steady circulation of the hydraulic fluid begins, and the loop heat pipe 10 starts up. Thus, the loop heat pipe 10 starts operating as a cooling system.

Here, the expression that the loop heat pipe 10 starts up means that, when the light source device 1 as a cooling target and a heat generating part is supplied with power and starts driving, the heat of the light source device 1 is transmitted to the evaporating unit 11 and the loop heat pipe 10 starts operating as a cooling system.

The startup time of the loop heat pipe 10, described later, refers to the time from when the heat is transmitted to the evaporating unit 11 (the driving of the light source device 1 starts) to when the loop heat pipe 10 starts operating as a cooling system.

Next, the operation after the startup of the loop heat pipe 10 will be described.

In the loop heat pipe 10, the hydraulic fluid 18 flows into the reservoir part (hydraulic fluid flow path 140) via the liquid pipe 14. The hydraulic fluid 18 is temporarily stored in the reservoir part. Then, the hydraulic fluid 18 in the reservoir part (hydraulic fluid flow path 140) is carried from the other outer surface side to the one outer surface side by the capillary action of the porous body 112. The hydraulic fluid 18 carried to the one outer surface side evaporates by being heated by the heat receiving unit 111.

The vapor generated at this point flows out of the evaporating unit 11 via the vapor flow path 130 and is guided through the vapor pipe 13 to the condensing unit 12. In the condensing unit 12, heat radiation is carried out and the vapor is condensed, thus generating the hydraulic fluid 18. The hydraulic fluid 18 generated in the condensing unit 12 moves through the liquid pipe 14 due to the pressure difference between the vapor flow path 130 and the hydraulic fluid flow path 140 and moves into the reservoir part (hydraulic fluid flow path 140).

With the above operation, the loop heat pipe 10 repeats the evaporation and condensation of the hydraulic fluid and thus transports the heat of the evaporating unit 11 (heat of the light source device 1) to the condensing unit 12.

Figure 3:
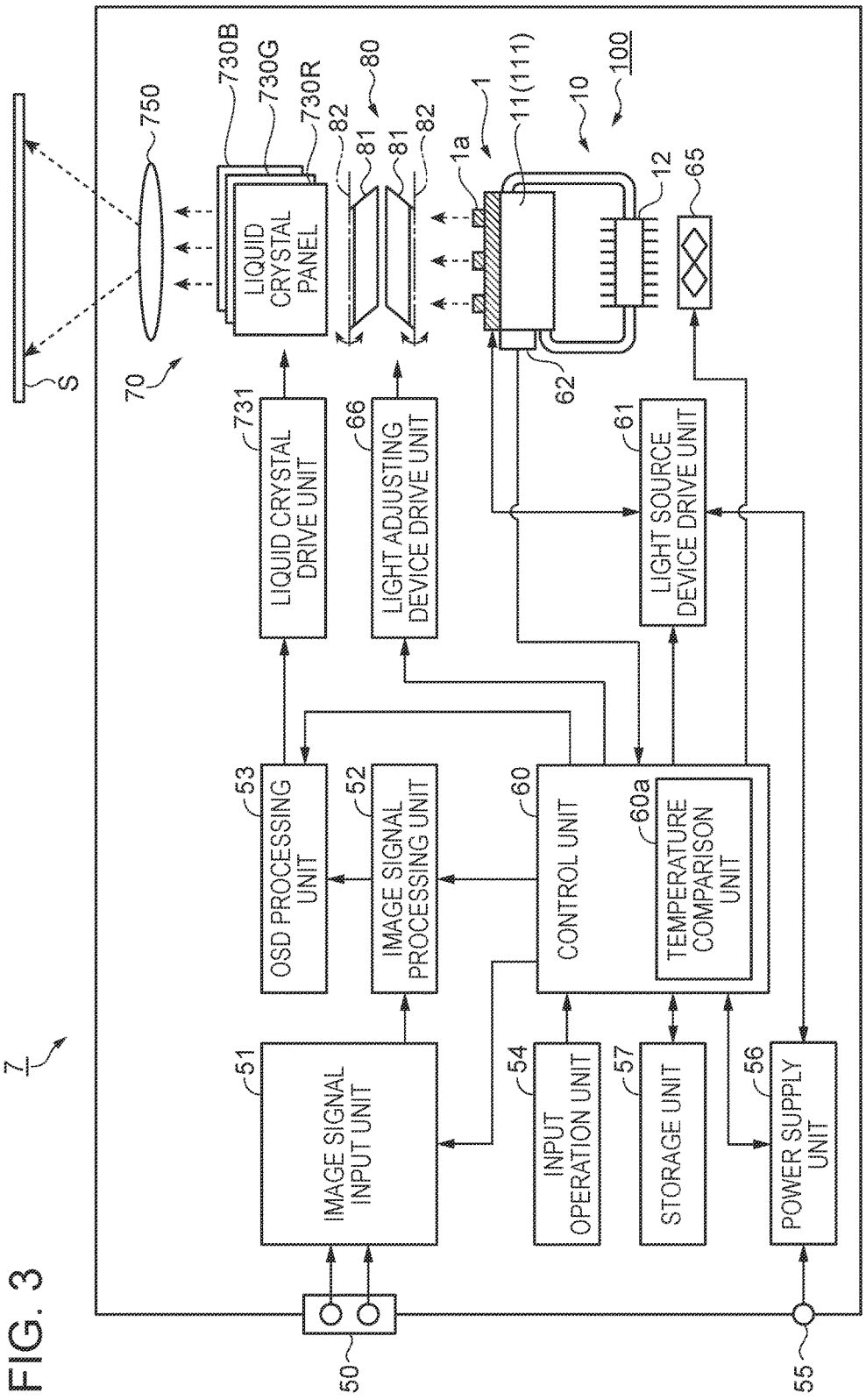
FIG. 3 shows a schematic configuration of circuitry in the projector.

FIG. 3 schematically shows a schematic configuration of the circuitry in the projector 7. The circuit configuration of the projector 7 will be described.

As shown in FIG. 3, the projector 7 is configured of an image signal input terminal 50, an image signal input unit 51, an image signal processing unit 52, an OSD (on-screen display) processing unit 53, an input operation unit 54, a power supply terminal 55, a power supply unit 56, a storage unit 57, a control unit 60, a light source device drive unit 61, a temperature detection unit 62, the cooling fan 65, a light adjusting device drive unit 66, the light source device 1, the loop heat pipe 10, the optical system 70, and a light adjusting device 80 or the like. These components are arranged inside an exterior casing (not illustrated) of the projector 7.

The optical system 70 includes a liquid crystal drive unit 731 in addition to the optical elements described above. The liquid crystal drive unit 731 applies drive voltage corresponding to inputted image data, to pixels forming each of the liquid crystal panels 730R, 730G, 730B.

The input operation unit 54 has an operation panel (not illustrated) having a plurality of operation keys (not illustrated) for the user to give various instructions to the projector 7. When the user operates an operation key of the input operation unit 54, the input operation unit 54 outputs an operation signal corresponding to the content of the operation by the user, to the control unit 60.

The image signal input unit 51, based on an instruction from the control unit 60, takes in image information from an external image output device such as a video playback device or PC (personal computer) via a plurality of image input terminals 50 for connecting cables, and outputs the image information to the image signal processing unit 52. The image signal input unit 51 may have a receiving unit for wireless communication, optical communication or the like, and may be configured to input an image signal wirelessly from an external device.

The image signal processing unit 52 converts the image information inputted from the image signal input unit 51 into image information representing the gradation level of each pixel of the liquid crystal panels 730R, 730G, 730B.

The OSD processing unit 53, based on an instruction from the control unit 60, carries out processing to display an OSD image such as a menu image or message image, as superimposed on a projected image.

The control unit 60 has a CPU (central processing unit), a RAM (random access memory) used to temporarily store various data, and the like, and controls the operation of the projector 7 as a whole by operating according to a control program (not illustrated) in the storage unit 57. That is, the control unit 60, along with the storage unit 57, functions as a computer.

The storage unit 57 is configured of a rewritable non-volatile memory such as a flash memory or FeRAM (ferroelectric RAM). In the storage unit 57, the control program for controlling the operation of the projector 7 and various setting data or the like that prescribes operating conditions or the like of the projector 7 are stored. In this embodiment, a predetermined temperature or the like set as a threshold with respect to the temperature of the evaporating unit 11 of the loop heat pipe 10 measured by the temperature detection unit 62 is recorded in the storage unit 57.

The temperature detection unit 62 is configured of a temperature sensor and installed in the heat receiving unit 111, which is near the base part 1b of the light source device 1, in the loop heat pipe 10 (evaporating unit 11). The temperature detection unit 62, based on an instruction from the control unit 60, detects the temperature of the heat receiving unit 111 and outputs detection data to the control unit 60. The control unit 60 has the function of a temperature comparison unit 60a which takes in the detection data (detected temperature) from the temperature detection unit 62 and compares the detection data with a predetermined temperature. The operation of the control unit 60 will be described in detail later.

The light source device drive unit 61, based on an instruction from the control unit 60, controls the supply and stop of power to the light source device 1 (laser light source 1a) and thus switches on and off the light source device 1. When switching on the light source device 1, the light source device drive unit 61 is supplied with power from the power supply unit 56 and supplies the power to the light source device 1, thus causing the laser light source 1a to emit excitation light.

When in normal operation (operation after the loop heat pipe 10 is started up), the light source device drive unit 61 functions to adjust the current applied to the light source device 1 so that the power supplied to the light source device 1 becomes constant. In this embodiment, when starting up the loop heat pipe 10, the light source device drive unit 61 supplies higher power than rated power (power in normal operation) to the light source device 1, based on an instruction from the control unit 60. Thus, when the loop heat pipe 10 starts up, the light source device 1 generates a greater amount of heat than the amount of heat generated in normal operation. Details will be described later.

The power supply unit 56 is supplied with power of AC 100 V or the like from outside via the power supply terminal 55. The power supply unit 56 converts grid power (AC power) into DC power with a predetermined voltage and supplies the converted power to each part of the projector 7. The power supply unit 56 also functions as a constant-current power supply which outputs a predetermined current to the light source device drive unit 61 in response to an instruction from the light source device drive unit 61.

The cooling fan 65 is installed near the condensing unit 12 of the loop heat pipe 10 and blow outside air (cooling air) to the condensing unit 12, thus cooling the heat of the condensing unit 12.

The light adjusting device 80 is installed between the first lens array 706 and the second lens array 707 of the optical system 70. The light adjusting device 80 in this embodiment adjusts the quantity of light of the light transmitted through the first lens array 706 and thus restrains the luminance of the projected image at the startup of the loop heat pipe 10 from becoming higher than in normal operation. The light adjusting device 80 also has the function of improving the contrast of the projected image in normal operation.

The light adjusting device 80 has a pair of light shielding plates 81, and various gears and a motor (not illustrated) for causing each of the light shielding plates 81 to rotate about an axis of rotation 82. Specifically, the light adjusting device 80, based on an instruction from the control unit 60, operates under the control of the light adjusting device drive unit 66. In the light adjusting device 80, as the motor and gears are driven to rotate by the light adjusting device drive unit 66, the pair of light shielding plates 81 rotates about the axes of rotation 82 in a positional relationship substantially symmetrical to each other, for example, with respect to a horizontal plane passing through an illumination optical axis Ax. With this operation, a part of the light emitted from the first lens array 706 is blocked, thus adjusting the quantity of light passed through. The light transmitted through the light shielding plates 81 becomes incident on the second lens array 707.

The heat transport device 100 in this embodiment is configured of the loop heat pipe 10, the control unit 60 (temperature comparison unit 60*a*), the light source device drive unit 61, the temperature detection unit 62, the cooling fan 65, the light adjusting device drive unit 66, and the light adjusting device 80 or the like.

Figure 4A:
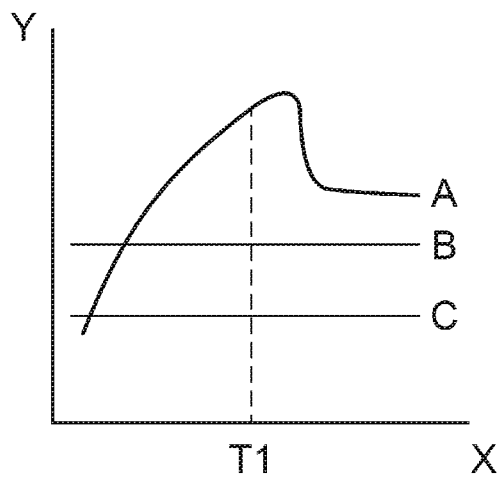
FIG. 4A explains driving at the startup of a loop heat pipe according to the related art.
Figure 4B:
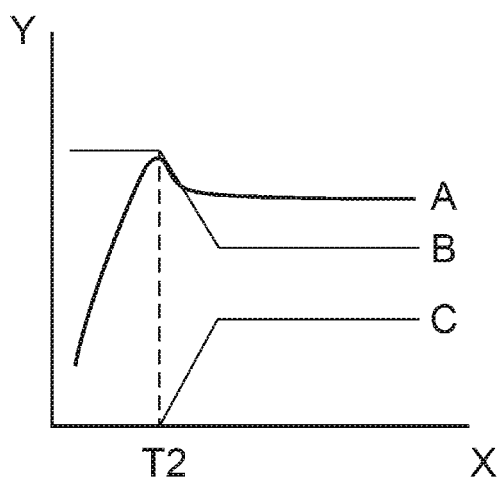
FIG. 4B explains driving at the startup of a loop heat pipe according to the embodiment.

FIG. 4A explains the driving at the startup of a loop heat pipe according to the related art. FIG. 4B explains the driving at the startup of the loop heat pipe 10 in this embodiment. FIGS. 4A and 4B conceptually explain the state at the time of driving. Also, it is assumed that the loop heat pipe 10 connected to the light source device 1 is similarly configured in the related-art example as well and that the heat receiving unit 111 is thermally connected to the base part 1*b* of the light source device 1.

In FIGS. 4A and 4B, a horizontal axis X represents the time elapsed from the startup of the light source device 1. A vertical axis Y represents a range showing the temperature A of the light source device 1, the amount of heat generated B by the light source device 1, and the drive voltage C of the cooling fan 65, in an intelligible manner.

As shown in FIG. 4A, according to the related art, the light source device 1 is driven by the light source device drive unit 61 in such a way as to provide constant brightness (driven with constant drive power) and therefore the amount of heat generated B is constant. In contrast, the temperature A of the light source device 1 gradually rises from the startup. During this process (at a time T1), the loop heat pipe 10 starts up and the heat of the light source device 1 is cooled down. Thus, the temperature of the light source device 1 can be kept substantially constant to a predetermined temperature (within rated temperature). At this point, the cooling fan 65 has already started driving, having a drive voltage applied thereto from the startup of the light source device 1.

In this case, the temperature A of the light source device 1 largely overshoots with respect to the rated temperature because the startup of the loop heat pipe 10 is delayed due to a delay in thermal conduction to the heat receiving unit 111 (delay of the time when the hydraulic fluid 18 becomes vapor in the evaporating unit 11).

Meanwhile, in the heat transport device 100 in this embodiment, as shown in FIG. 4B, when the light source device 1 starts driving, the light source device drive unit 61 applies a higher current than the rated current and drives the light source device 1 with higher power than the rated power, based on an instruction from the control unit 60. Therefore, the amount of heat generated B by the light source device 1 is larger than the rated amount of heat generated. Thus, larger heat is applied to the heat receiving unit 111 of the loop heat pipe 10, thereby making thermal conduction to the heat receiving unit 111 faster and realizing a time T2, which is shorter than the related-art time T1, as the startup time of the loop heat pipe 10. Thus, the amount of overshoot of the temperature A of the light source device 1 can be made smaller than in the related-art example. In this case, the cooling fan 65 in this embodiment has a drive voltage applied thereto and starts driving, when in the state where the light source device drive unit 61 starts driving the light source device 1, back to the rated power for normal operation, after the startup of the loop heat pipe 10.

Figure 5:
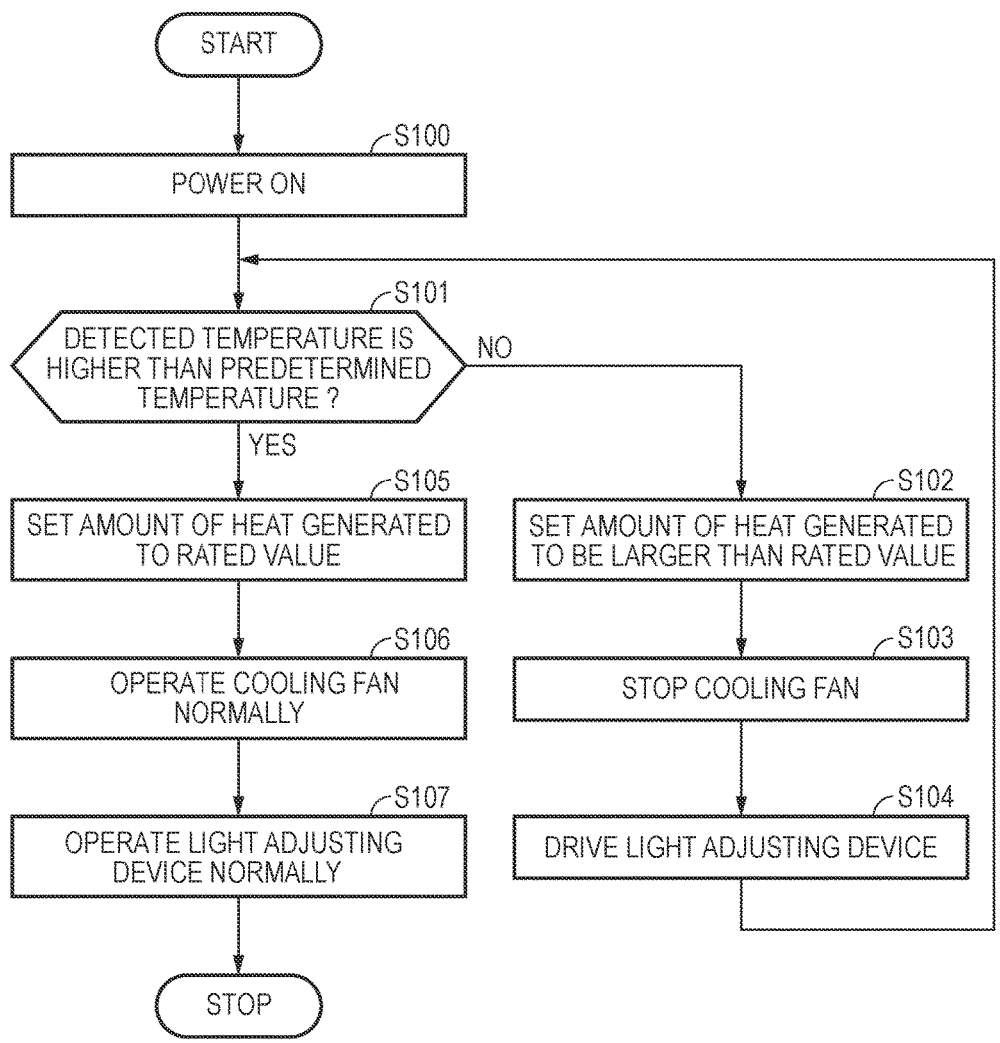
FIG. 5 is a flowchart showing the operation of a projector having a heat transport device.

FIG. 5 is a flowchart showing the operation of the projector 7 having the heat transport device 100. FIG. 5 shows a flow up to when the loop heat pipe 10 in this embodiment is started up.

As shown in FIG. 5, the power of the projector 7 is turned on (Step S100). In Step S101, the control unit 60 causes the temperature detection unit 62 installed in the heat receiving unit 111 of the loop heat pipe 10 to detect the temperature of the heat receiving unit 111, and causes the temperature comparison unit 60*a* to compare the detected temperature with a predetermined temperature. Specifically, the temperature comparison unit 60*a* determines whether the detected temperature is higher than a predetermined temperature or not. This detection is carried out on a predetermined sampling cycle.

Here, if it is determined that the detected temperature is lower than the predetermined temperature (NO in Step S101) (if the detected temperature does not reach the predetermined temperature), the processing shifts to Step S102. In Step S102, the control unit 60 controls the light source device drive unit 61 in such a way that the amount of heat generated by the light source device 1 temporarily becomes equal to or larger than a rated amount of heat generated.

Based on an instruction from the control unit 60, the light source device drive unit 61 gives an instruction to the power supply unit 56. Thus, the power supply unit 56 sends a set current (current at startup, i.e., higher current than current in normal operation) to the light source device drive unit 61. The light source device drive unit 61 applies the current from the power supply unit 56 to the light source device 1 and thus changes the amount of heat generated by the light source device 1 to a greater amount of heat generated than the rated amount of heat generated. Thus, a greater amount of heat than the rated amount of heat generated is applied to the heat receiving unit 111 of the loop heat pipe 10.

Next, the processing shifts to Step S103. In Step S103, the control unit 60 stops applying the drive voltage to the cooling fan 65. In other words, the driving of the cooling fan 65 is stopped. Next, the processing shifts to Step S104.

Here, when the drive power of the light source device 1 is changed to higher power than the rated power, consequently the luminance of a projected image is higher than the luminance of a projected image with the rated power. Thus, in Step S104, the control unit 60 outputs to the light adjusting device drive unit 66 an instruction to adjust light (restrain the quantity of light) so that the increased luminance is reduced to be equal to the rated luminance.

The light adjusting device drive unit 66, based on an instruction from the control unit 60, drives the light adjusting device 80 to rotate the pair of light shielding plates 81 about the axes of rotation 82 so as to achieve the set positional relationship. As the quantity of light is adjusted (restrained) by this operation of the light adjusting device 80, the higher luminance is reduced to the luminance with the rated power. Next, the processing shifts to Step S101. If the detected temperature is lower than the predetermined temperature, the foregoing process (Steps S102 to S104) is repeated.

If it is determined in Step S101 that the detected temperature is higher than the predetermined temperature (YES in Step S101) (if the detected temperature reaches the predetermined temperature), the processing shifts to Step S105. That the detected temperature is higher than the predetermined temperature refers to the state where the higher amount of heat than in the normal operation state of the light source device 1 is transferred to the heat receiving unit 111 of the loop heat pipe 10 and therefore the hydraulic fluid 18 in the vapor flow path 130 evaporates, thus causing the loop heat pipe 10 to start up, as shown in FIG. 2.

The predetermined temperature used for the comparison in the temperature comparison unit 60a is set to such a temperature that the loop heat pipe 10 securely starts up. The predetermined temperature is also set within an operating temperature range that guarantees the quality of the light source device 1.

In Step S105, the control unit 60 instructs the light source device drive unit 61 to change the amount of heat generated by the light source device 1 to the rated amount of heat generated. As the light source device drive unit 61 gives an instruction to the power supply unit 56, the power supply unit 56 sends the rated current (current in normal operation) to the light source device drive unit 61. The light source device drive unit 61 applies the current from the power supply unit 56 to the light source device 1 and thus changes the amount of heat generated by the light source device 1 to the rated amount of heat generated. Thus, the rated amount of heat generated is applied to the heat receiving unit 111 of the loop heat pipe 10. Next, the processing shifts to Step S106.

In Step S106, the control unit 60 starts applying the rated voltage to the cooling fan 65 and causes the cooling fan 65 to start normal operation. The cooling fan 65 starts operating and cools the condensing unit 12. Next, the processing shifts to Step S107.

In Step S107, the control unit 60 instructs the light adjusting device drive unit 66 to cause the light adjusting device 80 to operate normally. The light adjusting device drive unit 66, based on the instruction from the control unit 60, drives the light adjusting device 80 and causes the pair of light shielding plates 81 to rotate about the axes of rotation 82 so as to achieve the positional relationship in normal operation. Thus, the light adjusting device 80 starts normal operation.

The flowchart ends here.

With the above flowchart, the startup time of the loop heat pipe 10 can be made shorter than in the related-art technique and the amount of overshoot of the temperature of the light source device 1 from the startup can be reduced. Also, the luminance, increasing until the startup, can be reduced to the rated luminance.

When the loop heat pipe 10 is started up, if the light source device 1 maintains the rated amount of heat generated, the heat transport device 100 can stably maintain the subsequent cooling operation of the loop heat pipe 10. Thus, the light source device 1 is properly cooled by the cooling operation of the heat transport device 100.

The above embodiment has the following advantageous effects.

(1) In the heat transport device 100 according to this embodiment, the control unit 60 controls the amount of heat generated by the light source device 1 as a heat generating part, at the startup of the loop heat pipe 10. Thus, the evaporation of the hydraulic fluid 18 in the evaporating unit 11 can be controlled. Therefore, the startup time of the loop heat pipe 10 can be controlled as well. Also, the overshoot of the heating temperature of the light source device 1 can be controlled.

(2) In the heat transport device 100 according to this embodiment, with a simple configuration having the temperature detection unit 62 for detecting the temperature of the evaporating unit 11, the control unit 60 compares with the detected temperature detected by the temperature detection unit 62 with a predetermined temperature, and controls the amount of heat generated by the light source device 1 as a cooling target and a heat generating part to be temporarily equal to or larger than a rated amount of heat generated, if the detected temperature is lower than the predetermined temperature. Thus, the evaporation of the hydraulic fluid 18 in the evaporating unit 11 can be facilitated and the startup time of the loop heat pipe 10 can be reduced. Also, the overshoot of the heating temperature of the light source device 1 can be restrained.

(3) In the heat transport device 100 according to this embodiment, until the loop heat pipe 10 starts up, the cooling of the condensing unit 12 by the cooling fan 65 is not needed and therefore the cooling fan 65 is stopped. Thus, energy saving and noise reduction can be achieved.

(4) The projector 7 according to this embodiment has the heat transport device 100 in which the startup time of the loop heat pipe 10 is reduced. Therefore, when the projector 7 is driven, the light source device 1, which generates heat, can be properly cooled. Also, the overshoot of the heating temperature of the light source device 1 can be restrained.

(5) The projector 7 according this embodiment has the light adjusting device 80 and thus restrains the quantity of light until the loop heat pipe 10 starts up. Thus, the quantity of light can be adjusted to a rated quantity of light (quantity of light in normal operation) and the luminance until the startup of the loop heat pipe 10 can be adjusted to the luminance in normal operation after the startup. Therefore, the user can be restrained from feeling a sense of incongruity due to the difference in the luminance of the projected image.

Second Embodiment

Figure 6:
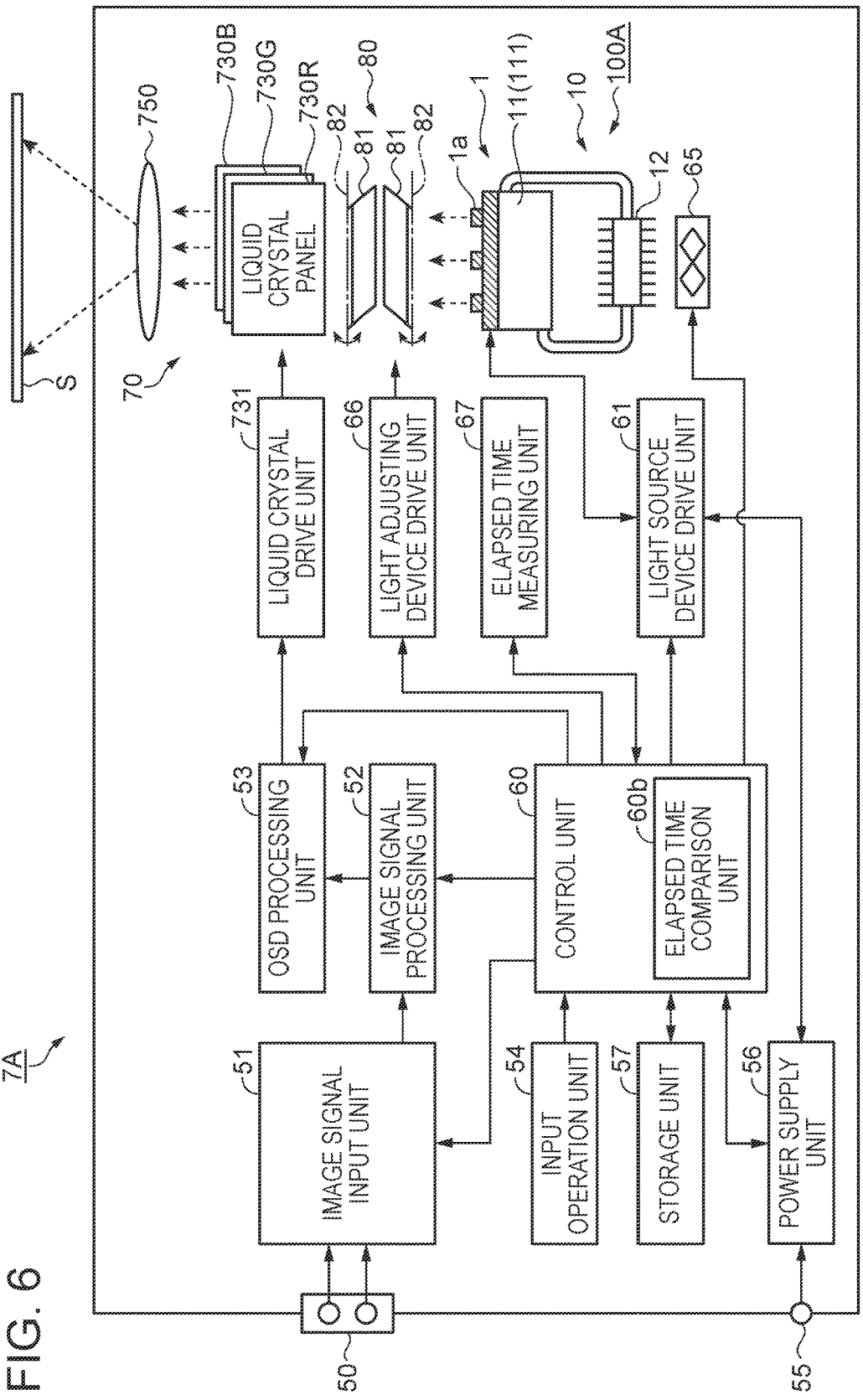
FIG. 6 shows a schematic configuration of circuitry in a projector according to a second embodiment.

FIG. 6 schematically shows a schematic configuration of the circuitry in a projector 7A according to a second embodiment. Referring to FIG. 6, the circuit configuration of the projector 7A in this embodiment will be described.

The circuit configuration of the projector 7A in this embodiment is different in the following features from the circuit configuration of the projector 7 in the first embodiment, and the other components are similar to those in the first embodiment. The similar components and components that operate similarly are denoted by the same reference signs as in the first embodiment.

The projector 7 in the first embodiment has the temperature detection unit 62 and the control unit 60 (temperature comparison unit 60a). However, the projector 7A in this embodiment has an elapsed time measuring unit 67 and the control unit 60 (elapsed time comparison unit 60b), instead of having the temperature detection unit 62 and the temperature comparison unit 60a.

Therefore, a heat transport device 100A in this embodiment is configured of the loop heat pipe 10, the control unit 60 (elapsed time comparison unit 60b), the light source device drive unit 61, the cooling fan 65, the light adjusting device drive unit 66, the elapsed time measuring unit 67, and the light adjusting device 80 or the like.

Hereinafter, the different components from the first embodiment will be described and the description of the similar components will be omitted.

The heat transport device 100A in this embodiment has the elapsed time measuring unit 67 for measuring the elapsed time from the startup of the light source device 1 as a cooling target. The elapsed time measuring unit 67 is configured of a timer or the like. The control unit 60 has the elapsed time comparison unit 60b and compares the elapsed time measured by the elapsed time measuring unit 67 with a predetermined time. If the elapsed time is shorter than the predetermined time, the control unit 60 controls the amount of heat generated by the light source device 1 to be temporarily equal to or larger than a rated amount of heat generated.

The predetermined time is the time until the startup of the loop heat pipe 10 in the case where the amount of heat generated by the light source device 1 is increased to the rated amount of heat generated or larger and where the increased heat is applied to the evaporating unit 11 (heat receiving unit 111). To set the predetermined time, data of the magnitude of the amount of heat generated and the time until the startup of the loop heat pipe 10 are measured, and the time until the loop heat pipe 10 starts up is securely set.

Figure 7:
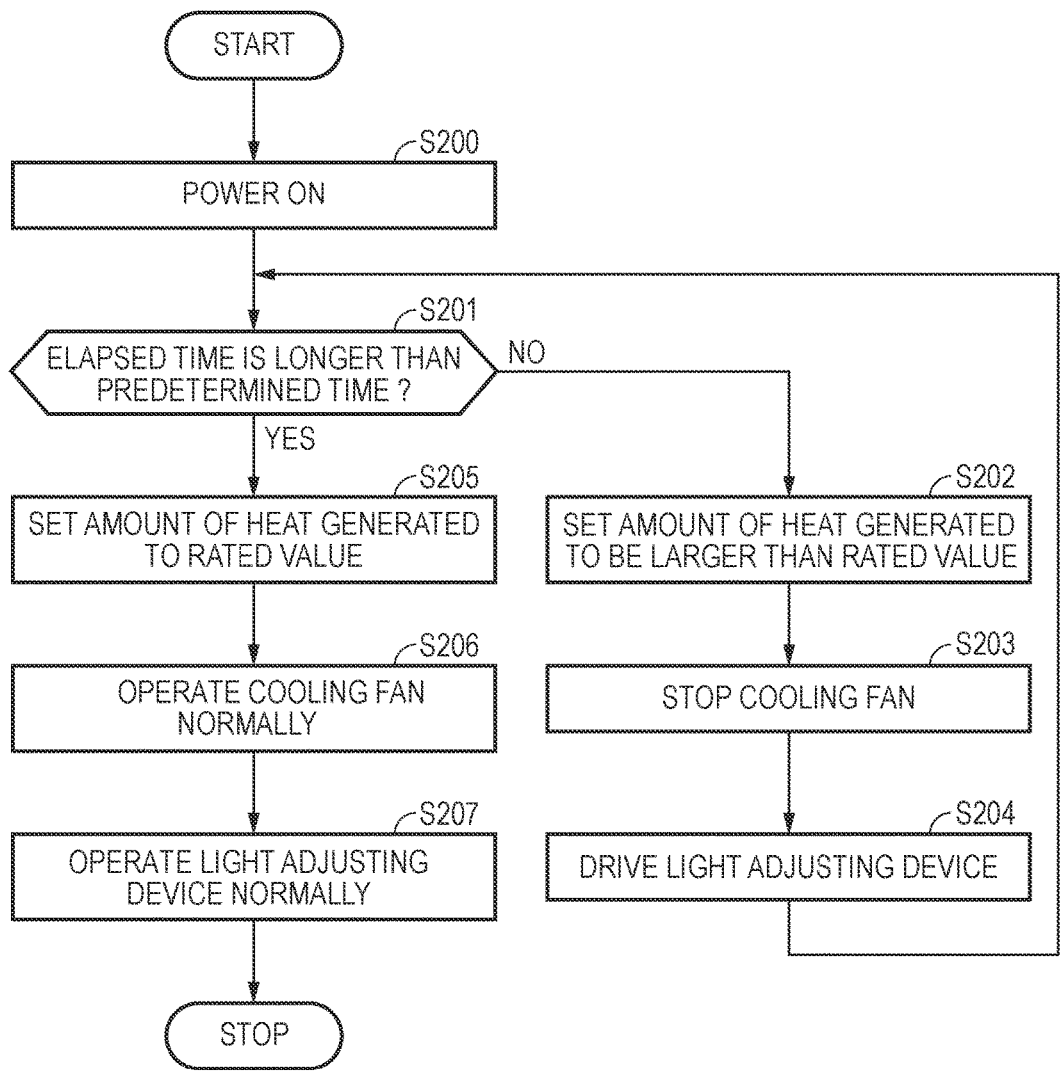
FIG. 7 is a flowchart showing the operation of a projector having a heat transport device.

FIG. 7 is a flowchart showing the operation of the projector 7A having the heat transport device 100A. Referring to FIG. 7, a flow until the loop heat pipe 10 in this embodiment starts up will be described.

As shown in FIG. 7, the power of the projector 7A is turned on (Step S200). In Step S201, the control unit 60 causes the elapsed time measuring unit 67 to measure the elapsed time from the startup of the light source device 1, which has started driving as the power is turned on. Then, the elapsed time comparison unit 60b compares the elapsed time with a predetermined time. Specifically, the elapsed time comparison unit 60b determines whether the elapsed time is longer than a predetermined time or not. This detection is carried out on a predetermined sampling cycle.

Here, if it is determined that the elapsed time is shorter than the predetermined time (NO in Step S201) (if the elapsed time does not reach the predetermined time), the processing shifts to Step S202. In Step S202, the control unit 60 controls the light source device drive unit 61 in such a way that the amount of heat generated by the light source device 1 temporarily becomes equal to or larger than a rated amount of heat generated.

Steps S202 to S204 are similar to the operations in Steps S102 to S104 in the first embodiment and therefore will be described only briefly.

In Step S202, based on an instruction from the control unit 60, the light source device drive unit 61 applies a set current outputted from the power supply unit 56 to the light source device 1 and thus changes the amount of heat generated by the light source device 1 to a greater amount of heat generated than the rated amount of heat generated. Thus, a greater amount of heat than the rated amount of heat generated is applied to the heat receiving unit 111 of the loop heat pipe 10.

In Step S203, the control unit 60 stops applying the drive voltage to the cooling fan 65. In other words, the driving of the cooling fan 65 is stopped.

In Step S204, the light adjusting device drive unit 66, based on an instruction from the control unit 60, drives the light adjusting device 80 to rotate the pair of light shielding plates 81 about the axes of rotation 82 so as to achieve the set positional relationship. By this operation of the light adjusting device 80, the higher luminance of the projected image is adjusted to the rated luminance. Next, the processing shifts to Step S201. If the elapsed time is shorter than the predetermined time, the foregoing process (Steps S202 to S204) is repeated.

If it is determined in Step S201 that the elapsed time is longer than the predetermined time (YES in Step S201) (if the elapsed time reaches the predetermined time), the processing shifts to Step S205. That the elapsed time is longer than the predetermined time refers to the state where the loop heat pipe 10 is started up, as shown in FIG. 2.

The subsequent Steps S205 to S207 are similar to the operations in the Steps S105 to S107 in the first embodiment and therefore will be described only briefly.

In Step S205, the amount of heat generated by the light source device 1 is changed to the rated amount of heat generated. Thus, the rated amount of heat generated is applied to the heat receiving unit 111 of the loop heat pipe 10.

In Step S206, the control unit 60 starts applying the rated voltage to the cooling fan 65 and causes the cooling fan 65 to start normal operation. The cooling fan 65 starts operating and cools the condensing unit 12.

In Step S207, the control unit 60 instructs the light adjusting device drive unit 66 to cause the light adjusting device 80 to operate normally. The light adjusting device drive unit 66, based on the instruction from the control unit 60, drives the light adjusting device 80 and causes the pair of light shielding plates 81 to rotate about the axes of rotation 82 so as to achieve the positional relationship in normal operation. Thus, the light adjusting device 80 starts normal operation.

The flowchart ends here.

The above embodiment can achieve advantageous effects similar to the effects (1) and (3) of the heat transport device 100 according to the first embodiment and the effects (4) and (5) of the projector 7 according to the first embodiment, and can also achieve the following advantageous effects.

(1) In the heat transport device 100A according to this embodiment, with a simple configuration having the elapsed time measuring unit 67 for measuring the elapsed time from the startup of the light source device 1, the control unit 60 compares the elapsed time measured by the elapsed time measuring unit 67 with a predetermined time, and controls the amount of heat generated by the light source device 1 as a cooling target and a heat generating part to be temporarily equal to or larger than a rated amount of heat generated, if the elapsed time is shorter than the predetermined time. Thus, the evaporation of the hydraulic fluid 18 in the evaporating unit 11 can be facilitated and the startup time of the loop heat pipe 10 can be reduced. Also, the overshoot of the heating temperature of the light source device 1 can be restrained.

The foregoing embodiments are not limiting. Various changes, improvements and the like can be made without departing from the scope of the invention. Some modifications will be described below.

In the heat transport device 100 according to the first embodiment, the driving of the cooling fan 65 is stopped until the loop heat pipe 10 starts up. However, this is not limiting. The cooling fan 65 may have its number of rotations restrained or may be driven with a rated voltage. The same applies to the second embodiment.

In the heat transport device 100 according to the first embodiment, the temperature detection unit 62 is installed in the evaporating unit 11 (heat receiving unit 111). However, the temperature detection unit 62 may be installed in the heat generating part (light source device 1).

The heat transport device 100 according to the first embodiment is used to cool the light source device 1 having the laser light source 1a. However, this is not limiting. The heat transport device 100 can also be used for a discharge-type light source device made up of a light source and a reflector or the like, or for a power supply unit. Also, the heat transport device 100 can be used for cooling targets other than the light source device or the power supply unit. The heat transport device 100 can also used for other electronic devices as well as for the projector. The same applies to the second embodiment.

In the heat transport device 100 according to the first embodiment, in the case where the light source device having the laser light source 1a is provided with a temperature sensor for maintaining the rated power applied to the laser light source 1a, control to return to the rated power can be carried out by using this temperature sensor, if the temperature of the light source device 1 exceeds an upper limit value.

Also, in the case where the light source device 1 is provided with a temperature sensor, this temperature sensor can be used as the temperature detection unit 62. In this case, the temperature of the evaporating unit 11 can be predicted from the temperature detected by the temperature sensor and can be used as the detected temperature of the evaporating unit 11.

The entire disclosure of Japanese Patent Application No. 2017-000921, filed Jan. 6, 2017 is expressly incorporated by reference herein.

What is claimed is:

1. A heat transport device comprising:
a loop heat pipe configured in the form of a loop, the loop heat pipe including
an evaporating unit configured to receive heat of a heat generating part as a cooling target and evaporate a hydraulic fluid,
a condensing unit configured to radiate heat and condense vapor obtained by evaporation of the hydraulic fluid,
a vapor pipe which connects the evaporating unit and the condensing unit to each other, and
a liquid pipe which connects the condensing unit and the evaporating unit to each other; and
a control unit configured to control an amount of heat generated by the heat generating part when the loop heat pipe starts up, wherein the control unit is configured to temporarily set the amount of heat generated by the heat generating part to an amount larger than a rated amount of heat generated when the loop heat pipe starts up.

2. The heat transport device according to claim 1, further comprising
a temperature detection unit configured to detect a temperature of at least one of the evaporating unit and the heat generating part,
wherein the control unit is configured to temporarily set the amount of heat generated by the heat generating part to the amount larger than the rated amount of heat generated when the detected temperature is lower than a predetermined temperature.

3. The heat transport device according to claim 1, further comprising
an elapsed time measuring unit configured to measure an elapsed time from startup of the cooling target,
wherein the control unit is configured to temporarily set the amount of heat generated by the heat generating part to the amount larger than the rated amount of heat generated when the measured elapsed time is shorter than a predetermined time.

4. The heat transport device according to claim 1, further comprising
a cooling fan configured to cool the condensing unit,
wherein the cooling fan is stopped or has its number of rotations restrained until the loop heat pipe is started up.

5. A projector comprising:
the heat transport device according to claim 1;
a light source device configured to emit light;
a light modulation device configured to modulate the light emitted from the light source device, according to image information; and
a projection device configured to project the light modulated by the light modulation device.

6. A projector comprising:
the heat transport device according to claim 2;
a light source device configured to emit light;
a light modulation device configured to modulate the light emitted from the light source device, according to image information; and
a projection device configured to project the light modulated by the light modulation device.

7. A projector comprising:
the heat transport device according to claim 3;
a light source device configured to emit light;
a light modulation device configured to modulate the light emitted from the light source device, according to image information; and
a projection device configured to project the light modulated by the light modulation device.

8. A projector comprising:
the heat transport device according to claim 4;
a light source device configured to emit light;
a light modulation device configured to modulate the light emitted from the light source device, according to image information; and
a projection device configured to project the light modulated by the light modulation device.

9. The projector according to claim 5,
wherein the cooling target is the light source device.

10. The projector according to claim 9, further comprising
a light source device drive unit configured to supply drive power to the light source device and drive the light source device, wherein the control unit is configured to adjust the drive power supplied to the light source device and thus control the amount of heat generated by the light source device as the heat generating part, when the loop heat pipe starts up.

11. The projector according to claim 10,
wherein the control unit is configured to supply the light source device with a drive power higher than a drive power supplied when the light source device operates normally and then set the amount of heat generated by the light source device to a rated amount of heat generated or larger.

12. The projector according to claim 11, further comprising
a light adjusting device configured to adjust a quantity of the light emitted from the light source device,
wherein the light adjusting device restrains the quantity of light until the loop heat pipe is started up.

* * * * *